United States Patent [19]

Tsui et al.

[11] Patent Number: 5,327,142
[45] Date of Patent: Jul. 5, 1994

[54] FREQUENCY ENCODING CIRCUIT IN BRAGG CELL RECEIVER

[75] Inventors: James B. Y. Tsui, Dayton; Joseph Caschera, Beavercreek, both of Ohio

[73] Assignee: The United States of America as represented by the Secretary of the Air Force, Washington, D.C.

[21] Appl. No.: 955,207

[22] Filed: Oct. 1, 1992

[51] Int. Cl.⁵ .................. G01S 7/285; G01R 23/17
[52] U.S. Cl. .......................... 342/192; 324/76.37; 324/76.31; 359/191
[58] Field of Search ............. 342/192, 20; 324/76.37, 324/76.31; 359/191

[56] References Cited

U.S. PATENT DOCUMENTS

| | | | |
|---|---|---|---|
| 3,732,565 | 2/1973 | Symaniec et al. | 342/192 |
| 4,328,576 | 5/1982 | Oakley | 324/76.37 |
| 4,610,540 | 9/1986 | Mossey | 342/192 X |
| 4,644,267 | 2/1987 | Tsui et al. | 359/130 |
| 4,909,627 | 3/1990 | Brousseau | 342/192 X |
| 5,153,597 | 10/1992 | Hueber et al. | 342/192 |
| 5,191,346 | 3/1993 | Avignon et al. | 342/192 X |

OTHER PUBLICATIONS

J. B. Y. Tsui, WL/AAWP-1, E. T. Gill, Litton Applied Tech, The International Society for Optical Engineering (SPIE) Optical Tech For Microwave Appl. V Apr. 1991, vol. 1476, pp. 190-200.

Primary Examiner—Gilberto Barrón, Jr.
Attorney, Agent, or Firm—Bernard E. Franz; Thomas L. Kundert

[57] ABSTRACT

The circuit may be used to encode the channel outputs of a Bragg cell receiver, or other type of channelized receiver. Bragg cell receivers use acousto-optic delay lines to analyze signals such as radar pulses present in the Electronic Warfare (EW) environment. These receivers require high probability of intercept with low false alarm rates. The present design in determining frequency from a Bragg receiver is by comparing the amplitude from adjacent outputs. If the output of a certain channel is higher than its neighboring ones and the signal crosses threshold, the frequency of the input signal is determined by that channel. There is one major deficiency from this approach, that is, the design generates false alarms. A frequency encoding circuit is proposed which uses five adjacent channels to make a decision on whether a given output is a true signal, or a false alarm. With this approach, two guard channels will be needed at both ends of the channels.

2 Claims, 5 Drawing Sheets

FREQUENCY ENCODING CIRCUIT IN BRAGG CELL RECEIVER

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a frequency encoding circuit for a Bragg cell receiver (or other types of channelized receivers) to reduce false alarms. More particularly, the invention relates to the field of receivers which use acousto-optic delay lines to analyze signals such as radar pulses present in the Electronic Warfare (EW) environment. The circuit may be used to encode the channel outputs of a Bragg cell receiver, or other types of channelized receiver. The receivers are of the type proposed for use in Electronic Warfare requiring high probability of intercept with low false alarm rates.

The present design in determining frequency from a Bragg receiver is by comparing the amplitude from adjacent outputs as shown in FIG. 2. If the output of a certain channel is higher than its neighboring ones and the signal crosses threshold, the frequency of the input signal is determined by that channel. There is one major deficiency from this approach, that is, the design generates false alarms. For example, in FIG. 2, if the input signal is in channel C, the output from C is much stronger than B and D. As a result, the output from C is one, the remaining outputs are zeros, and there are no false alarms. However, if the input signal is in H, the signal strengths in B, C, and D are weak. Theoretically, the outputs should be D>C>B, because D is closer to the signal than C which is closer than B. The difference may be very small, because they are far away from the input signal. If the gain in every channel is not perfectly balanced, i.e., in actual hardware design, it is possible that D<C>B. Under this condition, the output C does have an output which represents a false alarm. This phenomenon occurs especially in receivers designed with high dynamic range.

The following United States patents are of interest.
U.S. Pat. No. 4,328,576—Oakley
U.S. Pat. No. 4,644,267—Tsui et al The Oakley patent describes a system in which phase shift keyed signals are detected and demodulated over a wide bandwidth using a two-channel Bragg cell having two sonic input transducers.

The Tsui et al patent describes a system which makes use on an interferometric Bragg cell for the time delays needed by multiple antenna inputs in an angle-of-arrival (AOA) measurement system, for accurate measurements over wide bandwidths.

A paper by E. T. Gill and J. B. Y. Tsui on "Interferometric Acousto-optic Receiver Results" reports experimental results and conclusions on the performance of an interferometric acousto-optic receiver (IAOR). The receiver is designed to acousto-optically channelize a 1 GHz RF bandwidth spectrum into 128 frequency bins, and generate a digital frequency, pulse amplitude, pulse width and TOA (time-of-arrival) words. This paper and the Tsui patent are hereby incorporated by reference.

SUMMARY OF THE INVENTION

An objective of the invention is to provide a frequency encoding circuit for a Bragg cell receiver (or other types of channelized receivers) to reduce false alarms.

The frequency encoding circuit according to the invention uses five adjacent channels to make a decision on whether a given output is a true signal, or a false alarm. With this approach, two guard channels will be needed at both ends of the channels.

DETAILED DESCRIPTION

Figure 1:
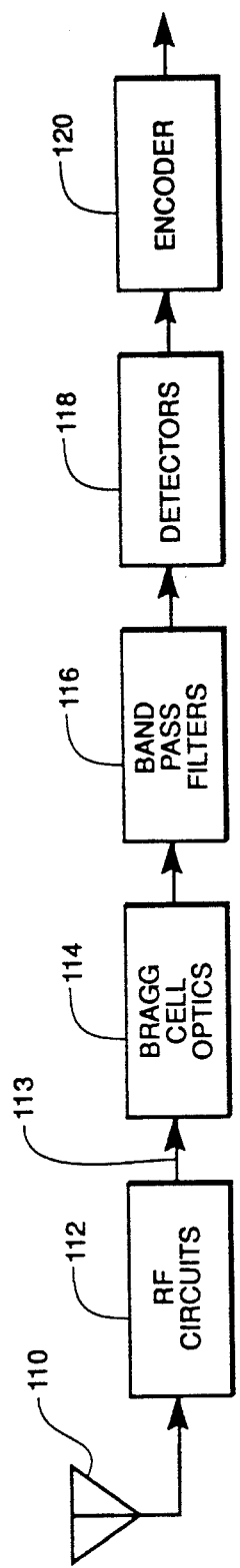
FIG. 1 is a block diagram showing a Bragg cell receiver system which includes a frequency encoding circuit.

A block diagram of a Bragg cell receiver system is shown in FIG. 1. An antenna system 110 supplies RF signals via RF circuits 112 and a RF line 113 to Bragg cell optics apparatus 114. Broad band output from photo detectors of the apparatus 114 is supplied to a bank of band pass filters 116, which have contiguous frequency response. The output from the filter 116 is supplied via detectors 118 to an encoder 120.

Figure 1A:
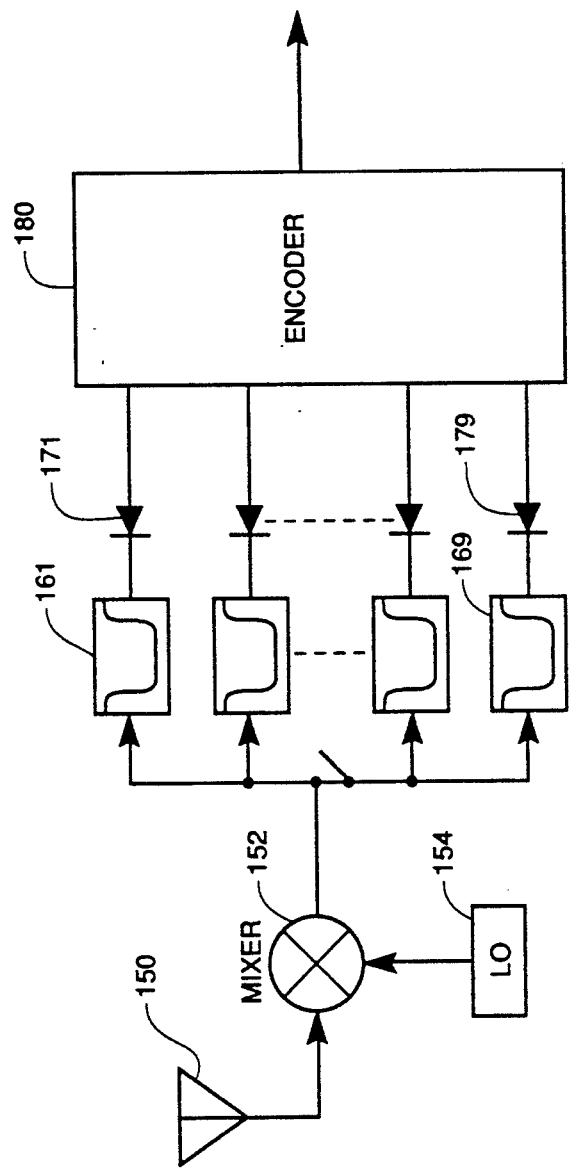
FIG. 1a is a diagram of a general channelized receiver.

The invention may also be applied to an radar warning receiver system which does not use optical apparatus, as shown in simplified form in FIG. 1a. RF signals from an antenna system 150, and signals from a local oscillator 154, are supplied to a mixer 152. The broadband output from the mixer 152 is supplied via a bank of filters 161–169, and detectors 171–179, to an encoder 180.

Figure 2:
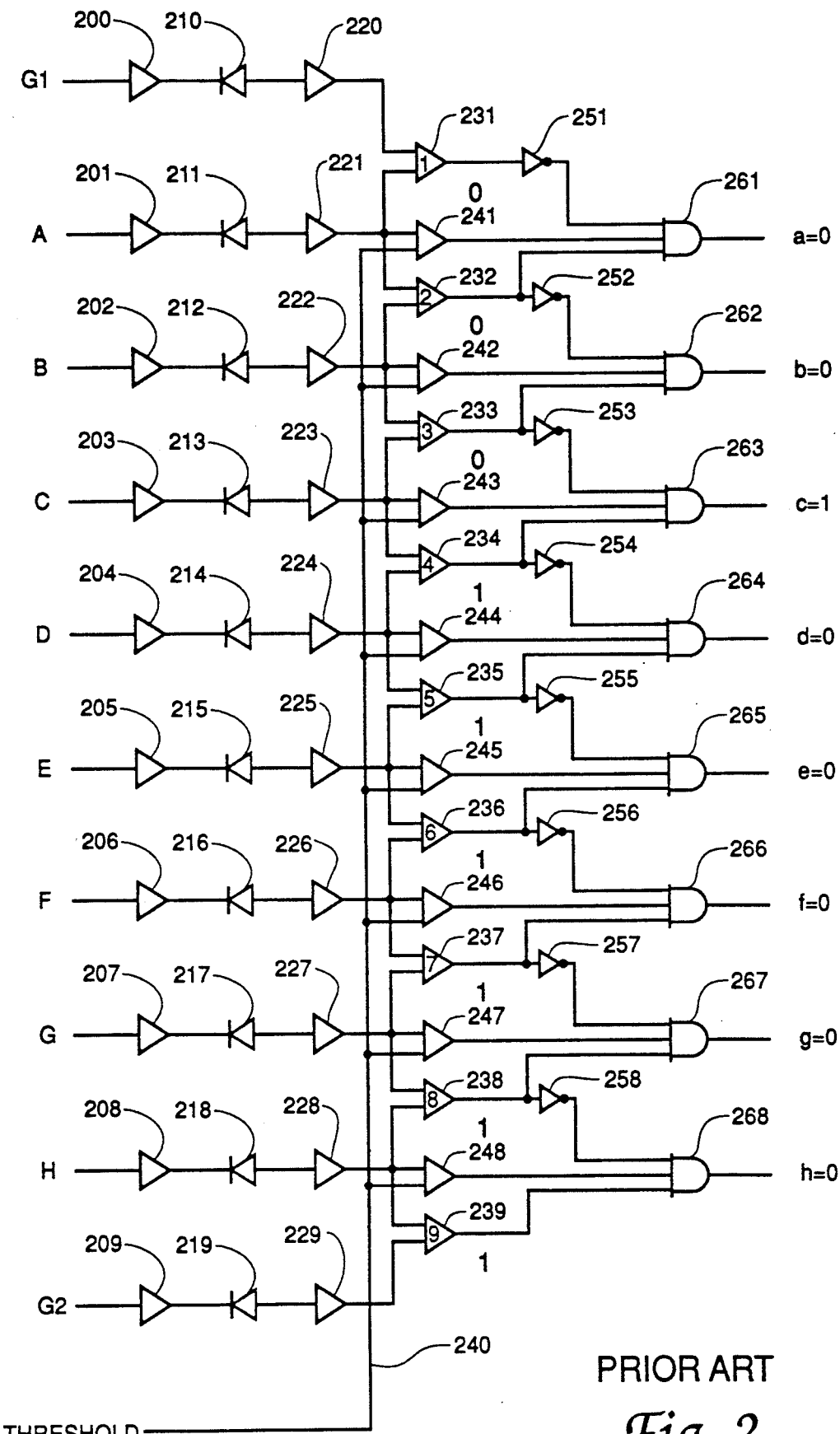
FIGS. 2 and 2a are schematic diagrams of a prior art frequency encoding circuit.
Figure 2A:
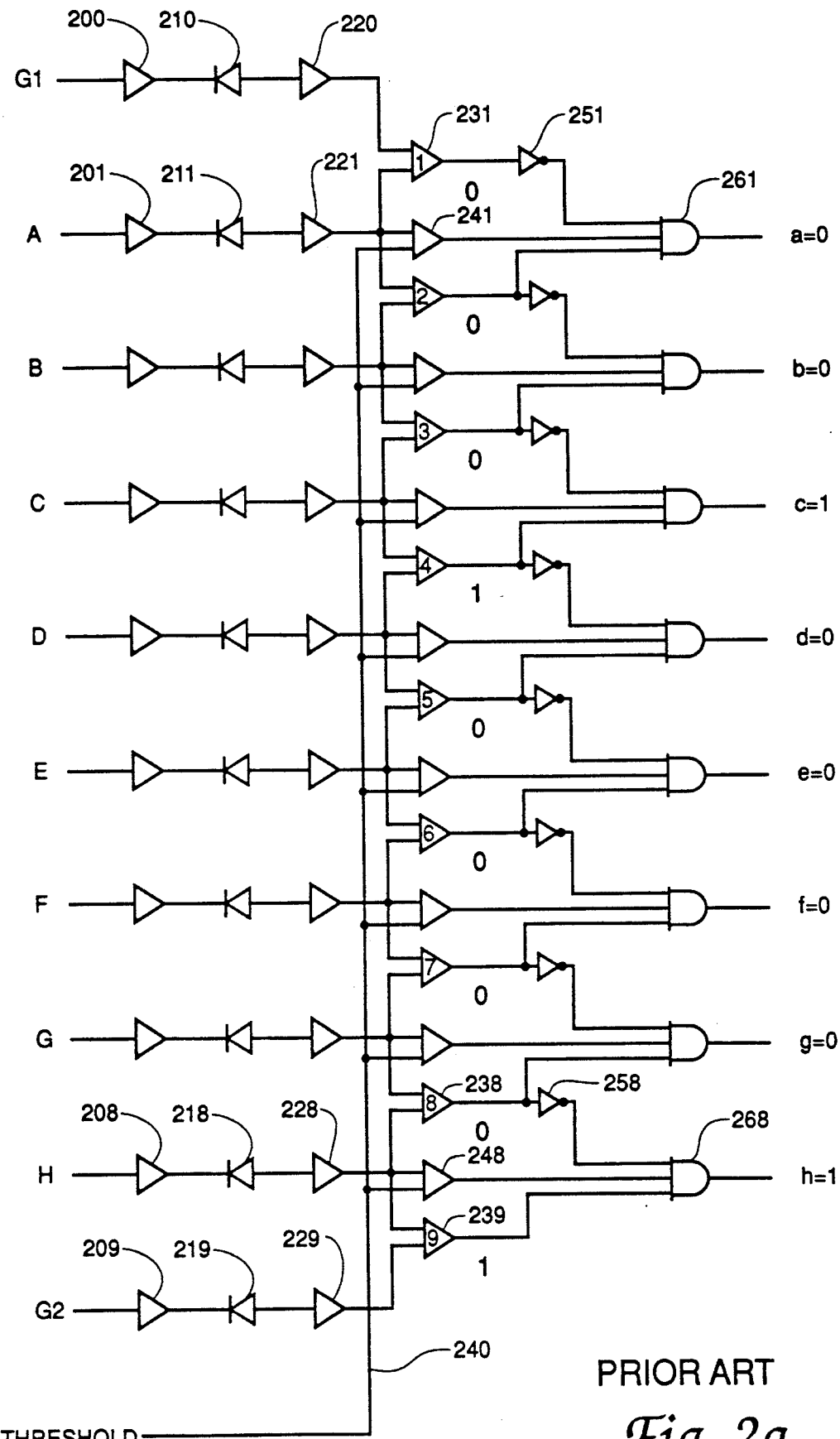
Figure 3:
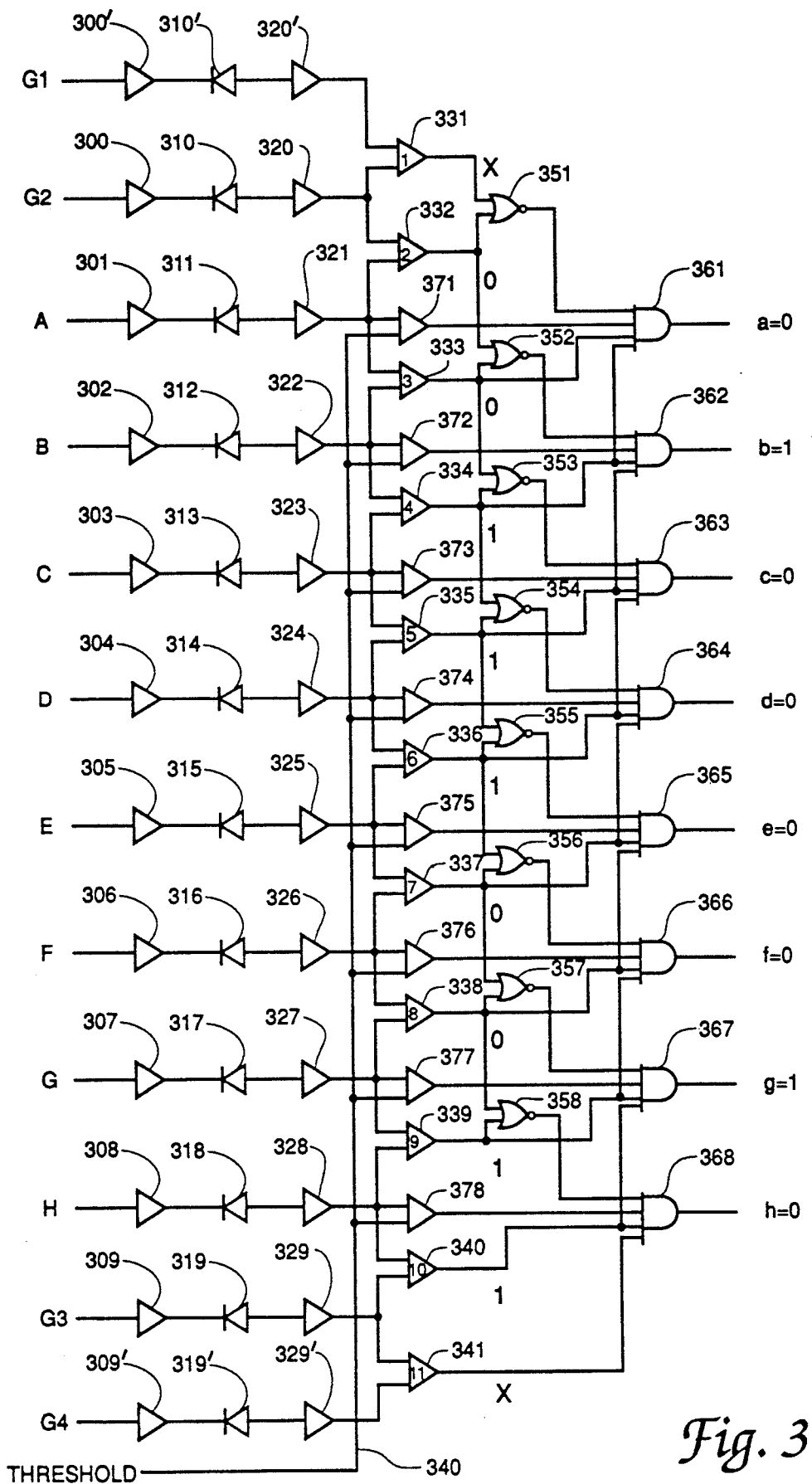
FIG. 3 is a schematic diagram of a frequency encoding circuit according to the invention.

The circuits shown in FIGS. 2, 2a and 3 represent either the encoder 120 of FIG. 1 or the encoder 180 of FIG. 1a. FIG. 2 shows digital signals for an ideal output in the prior art, and FIG. 2a shows the same circuit with signals which represent a false output. FIG. 3 shows a proposed encoder according to the invention to reduce false alarms.

In the prior art circuit of FIGS. 2 and 2a, for an eight-output Bragg cell receiver, ten inputs are required to allow for a guard channel on either end of the band for proper operation. The eight inputs A–H are coupled via respective amplifiers 211–218, respective detectors 210–219, and respective amplifiers 221–229 to comparator circuits. The guard channel G1 is coupled via amplifier 200, detector 210 and amplifier 220, while the guard channel G2 is coupled via amplifier 209, detector 219 and amplifier 229. (The detectors 210–219 correspond to the detectors 118 of FIG. 1, or the detectors 171–179 of FIG. 1a.)

There are nine comparator devices 231–239, each of which has inputs from two adjacent channels. Thus, the first comparator 231 has inputs from amplifiers 220 and 221 for the guard channel G1 and the first signal channel, the second comparator 232 has inputs amplifiers 221 and 222 for the signal channels A and B, and so on down to the last comparator 239 having inputs from amplifiers 228 and 229 for the last signal channel H and the guard channel G2. When the upper input of a comparator is higher than the lower input, the comparator output is positive (digital 1), and when the upper input is lower than the lower input, the output is zero. The outputs of the comparators 231-238 go via inverters 251-258 respectively to inputs of AND gates 261-268 respectively. The outputs of comparators 232-239 also go directly to inputs of gates 261-268 respectively. There are also eight threshold comparator devices 241-248 which have respective inputs from amplifiers 221-228 for the signal channels A-H. Each of these threshold devices has a second input from a threshold signal line 240. The outputs of the threshold devices go to inputs of the gates 261-268. (The circuits following the amplifiers 220-229 comprise the encoder 120 or 180 of FIGS. 1 or 1a.)

The design can be considered in the following truth table for the outputs of the comparators 231-239 in FIG. 2a. When the input is at C, the ideal output will be 000111111. After decoding, the outputs at a, b, . . . , h are 00100000 where the location of the 1 represents the frequency of the input signal. If there is any imbalance in the channels, the outputs from the comparators can become 001111011 as shown in FIG. 2a. The outputs at the channels will be 00100001 where the location of the second 1 represents a false alarm. The basic idea in the above encoding scheme involves comparing each channel with its two adjacent channels. Any time there is a 0 to 1 transition at the comparator outputs, a frequency will be reported.

In the proposed approach, each channel is compared to its four neighboring channels (two on either side of the given channel). It will take five channels to make a decision. One looks for a 0011 pattern. Such a pattern means that if an input signal is truly in a certain channel, its output should be at least higher than its four neighboring channels on both sides. One of the approaches to accomplish such a design is shown in FIG. 3. With this arrangement, if there is a 0011 pattern and the output crosses threshold, the output of the channel with the input signal will have a one.

In the circuit of FIG. 3, for an eight-output Bragg cell receiver, twelve inputs are required to allow for two guard channels on either end of the band. The eight inputs A-H are coupled via respective amplifiers 311-318, respective detectors 310-319, and respective amplifiers 321-329 to comparator circuits. The guard channel G2 is coupled via amplifier 300, detector 310 and amplifier 320, while the guard channel G3 is coupled via amplifier 309, detector 319 and amplifier 329. In addition, the guard channel G1 is coupled via amplifier 300', detector 310' and amplifier 320'; while the guard channel G4 is coupled via amplifier 309' detector 319' and amplifier 329'. There are eleven comparator devices 331-341, each of which has inputs from two adjacent channels. Thus, the first comparator 331 has inputs from amplifiers 320' and 320 for the guard channels G1 and G2, the second comparator 332 has inputs from amplifiers 320 and 321 for the guard channel G2 and the signal channel A, the third comparator 333 has inputs from amplifiers 321 and 322 for the signal channels A and B, and so on down to the last comparator 341 having inputs from amplifiers 329 and 329' for the guard channels G3 and G4. The outputs of the comparators 331-338 go via upper inputs of NOR gates 351-358 respectively to inputs of AND gates 361-368 respectively. The outputs of the comparators 332-339 also go via lower inputs of NOR gates 351-358 respectively to inputs of AND gates 361-368 respectively. The outputs of comparators 333-339 and 340 also go directly to inputs of gates 361-368 respectively. There are also eight threshold comparator devices 371-378 which have respective inputs from amplifiers 321-328 for the signal channels A-H. Each of these threshold devices has a second input from a threshold signal line 340. The outputs of the threshold devices go to inputs of the gates 361-368.

With the proposed approach, two guard channels will be needed at both ends of the channels. The conventional approach needs only one channel at each end. As always true in engineering design, the reduction in false alarms means reduction in probability of detection. This approach will reduce the dynamic range of the receiver on simultaneous signals.

Figure 4:
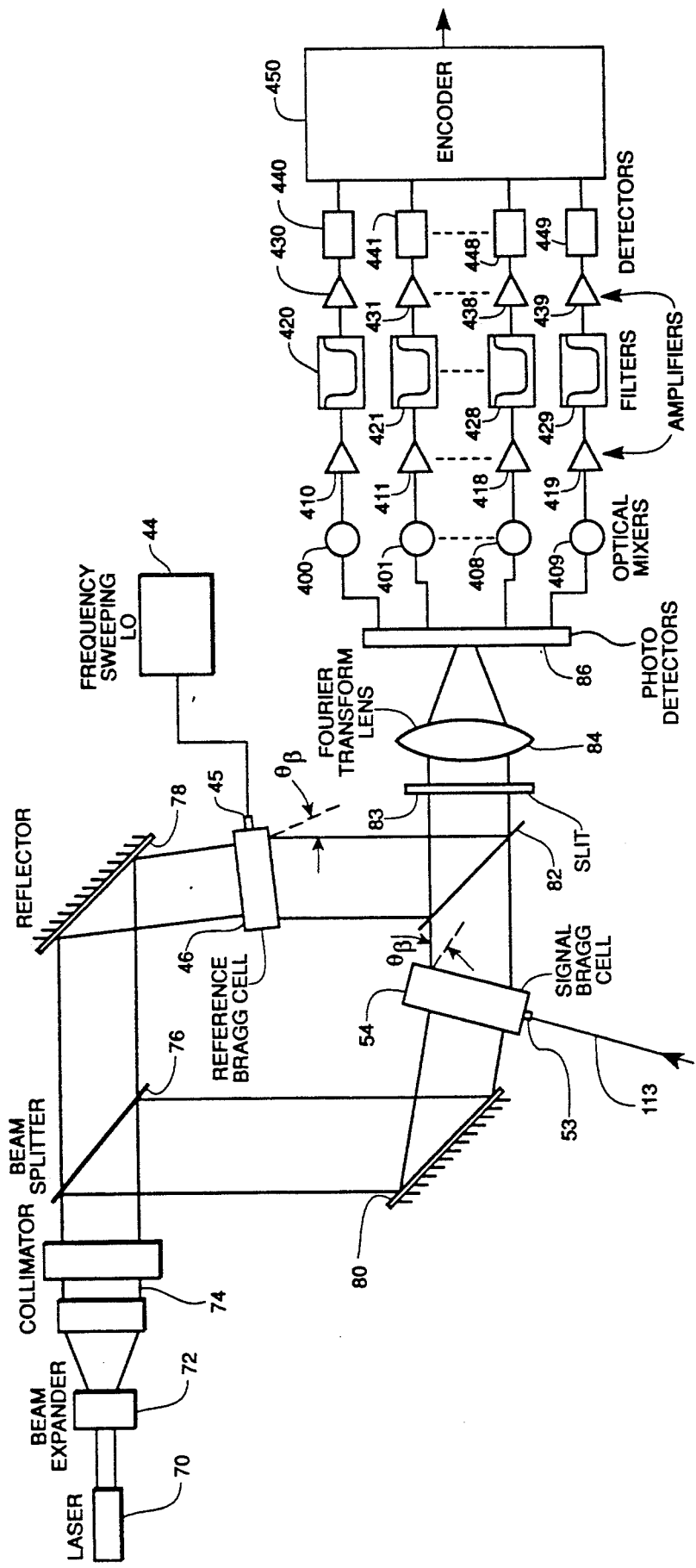
FIG. 4 is a functional block diagram of receiver which includes an interferometric Bragg cell arrangement and a frequency encoding circuit.

FIG. 4 illustrates the employment of an interferometric Bragg cell system. The RF input signals are coupled via transducer means 53 to a signal Bragg cell 54. A frequency sweeping local oscillator 44 is coupled via a transducer 45 to a reference Bragg cell 46.

Coherent light from a laser 70 passes through a beam expander 72, and a collimator 74 to a beam splitter 76. The reflected beam from the beam splitter 76 via a reflector 80 is directed to the signal Bragg cell 54; while the transmitted beam from the beam splitter via a reflector 78 is directed to the reference Bragg cell 46. The aforementioned two beams are diffracted in their respective Bragg cells and are directed to opposite sides of a beam splitter 82. The reflected beam from reference cell 46, and the transmitted beam from the signal cell 54, together pass through a slit 83 and a Fourier Transform lens 84 and are focused on photo detectors 86.

Outputs from the photo detectors 86 are coupled via optical mixers 400-409 and amplifiers 410-419 to bandpass filters 420-429 into separate contiguous bands. Outputs from the filters are coupled via amplifiers 430-439 and detectors 440-449 to the encoder 450.

Summary

This technique will reduce the false alarms in Bragg cell receivers which is one of the major deficiencies of the receiver.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measuring receiver which includes an encoder having N encoder outputs for determining frequency, wherein the receiver also includes an RF source coupled via interferometric Bragg cell acousto-optic means and photo detector means to N+4 filters for dividing a frequency band into N+4 contiguous channels comprising N principal channels, two guard channels at a first end of the band and two guard channels at a second end of the band, each of the N+4 filters having an output coupled via a detector to the encoder, so that signals from the detectors are supplied to the encoder;

wherein said encoder comprises $N+3$ comparators, with each comparator having two inputs coupled respectively to the outputs of two detectors for two adjacent channels for comparing amplitudes of the signals from said detectors, each comparator having an output, N NOR gate devices, with each NOR gate device having inputs from the outputs of two of said comparators for adjacent channels, N threshold comparators for comparing the signal from the detector for each principal channel to a signal on a threshold input line, each threshold comparator having an output to provide a threshold exceeded signal for each principal channel in which the output from the detector is greater than a preselected threshold value, N AND gate devices, each having first, second, third and fourth inputs, with each AND gate device having its first input coupled to the output of one of the NOR gate devices, its second input coupled to the output of one of the threshold devices, and its third and fourth inputs coupled to the outputs of adjacent ones of the comparators, so that signals from five detectors for five adjacent channels are compared for each principal channel, so that for any principal channel for which there is a threshold exceeded signal and the signal from the detector for that channel is greater than that of the two adjacent channels on either side an encoder output is produced indicating that a signal has a frequency within that channel.

2. A frequency measuring receiver which includes an encoder having N encoder outputs for determining frequency, wherein the receiver also includes $N+4$ filters for dividing a frequency band into $N+4$ contiguous channels comprising N principal channels, two guard channels at a first end of the band and two guard channels at a second end of the band, each of the $N+4$ filters having an output coupled via a detector to the encoder, so that signals from the detectors are supplied to the encoder;

wherein said encoder comprises comparison means for comparing amplitudes of the signals from said detectors, with signals from detectors for each principal channel being compared to signals from two detectors on either side, so that signals from five detectors for five adjacent channels are compared for each principal channel, threshold means for comparing the signals from the detectors for each principal channel to provide a threshold exceeded signal for each principal channel in which the output from the detector is greater than a preselected threshold value, so that for any principal channel for which there is a threshold exceeded signal and the signal from the detector for that channel is greater than that of the two adjacent channels on either side an encoder output is produced indicating that a signal has a frequency within that channel.

* * * * *